(12) United States Patent
Bakounine et al.

(10) Patent No.: US 6,753,042 B1
(45) Date of Patent: Jun. 22, 2004

(54) DIAMOND-LIKE CARBON THIN FILM COATING PROCESS

(75) Inventors: Oleg Markovich Bakounine, Ekaterinburg (RU); Serguei Aleksandrovich Plotnikov, Ekaterinburg (RU); Ilia Shmulevich Trakhtenberg, Ekaterinburg (RU); Kensuke Uemura, Kamukura (JP)

(73) Assignee: ITAC Limited, Tokyo (JP)

( * ) Notice: Subject to any disclaimer, the term of this patent is extended or adjusted under 35 U.S.C. 154(b) by 0 days.

(21) Appl. No.: 09/563,807

(22) Filed: May 2, 2000

(51) Int. Cl.$^7$ ............................................... B32B 23/08
(52) U.S. Cl. .................... 427/526; 427/131; 427/249.1; 427/249.7; 427/523; 427/577
(58) Field of Search ................. 427/523, 526, 427/577, 131, 249.1, 249.7

(56) References Cited

U.S. PATENT DOCUMENTS

| | | | |
|---|---|---|---|
| 3,906,889 A | * 9/1975 | Omura et al. ................... | 118/5 |
| 4,992,153 A | 2/1991 | Bergmann et al. | |
| 5,858,477 A | * 1/1999 | Veerasamy et al. ......... | 427/562 |
| 6,149,778 A | * 11/2000 | Jin et al. ............... | 204/192.22 |

FOREIGN PATENT DOCUMENTS

WO 95/18442 7/1995

OTHER PUBLICATIONS

Diamond–like carbon—present status, by Y. Lifshitz, Diamond and Related Materials 8 (1999) 1659–1676, no month avail.

DLC coating for video head, by I.Sh. Trakhtenberg et al., Diamond and Related Materials 8 (1999) 1770–1775, no month avail.

Improved–quality needles with a diamond–like coating (DLC) for stitching machines and their production technology, by I.Sh. Trakhtenberg et al., Diamond and Related Materials 8 (1999) 1765–1769, no month avail.

The effect of additional treatment on tribological properties of amorphous carbon coatings on metals, by I. Sh. Trakhtenberg et al., Diamond and Related Materials 4 (1995) 1020–1024, no month avail.

Modification of amorphous diamond–like films by bombardment with low–energy ions, by I. Sh. Trakhtenberg et al., Diamond and Related Materials 5 (1996) 943–946, no month avail.

The Use of STM for Investigation of Surface Relief in Respect to Tribologic Properties of DLC Coatings, by V.L. Arbuzov et al., Journal De Physique IV, Colloque C5, supplement au Journal de Physique III, vol. 6, Sep. 1996.

The Effect of DLC Coating on the Properties of Magnetic Audio Heads, by A.E. Davietshin et al., Journal of Chemical Vapor Deposition. vol. 4—Oct. 1995.

The Effect of Substrate Rougness and DLC Growth Morfology on the Coating Tribology, by A.B. Vladimikov et al., Institute of Metal Physics, Ekaterinburg, Russian Federation, 628–632, no date avail.

Improvement of diamond–like carbon (DLC) coatings adhesion to substrates by means of intermediate layer having gradient composition, by I.Sh. Trakhtenberg et al., Institute of Metal Physics, Ekaterinburg, Russian Federation, 623–626, no date avail.

Breakdown of a–C coatings on ion–implantation–modified metal alloys with a jet of abrasive particles. by S.D. Gorpinchenko et al., Diamond and Related Materials, 3 (1994) 779–782, no month avail.

Apr. 1, 1995 MeC:CH–Coatings Produced by Arc–Ionplating Process, Repenning, D., Le Vide: Science, Technique et Applications, vol. 51, No. 276, pp. 197–209.

* cited by examiner

*Primary Examiner*—Bernard Pianalto
(74) *Attorney, Agent, or Firm*—Jordan and Hamburg LLP

(57) ABSTRACT

Wear-resistant and low-friction hard amorphous, diamond-like carbon coating (DLC) is formed directly on an eternal surface of a magnetic recording media sensor (MRMS). The coating demonstrates a high degree of hardness, low friction coefficient and moderate electric resistivity, providing abrasion-proof, low-clogging, static electricity-deterrent properties.

24 Claims, 8 Drawing Sheets

View A-A
Floppy Disc Head

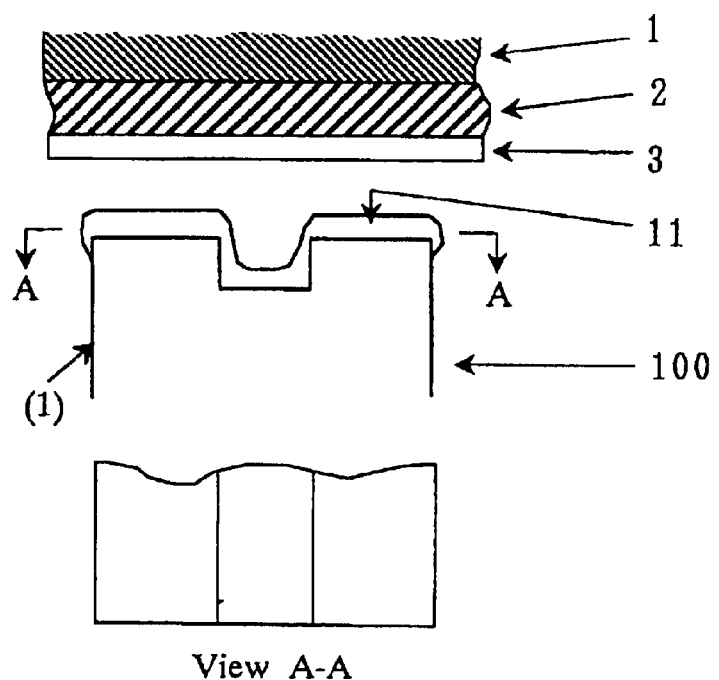
FIG.1 (A) Floppy Disc Head
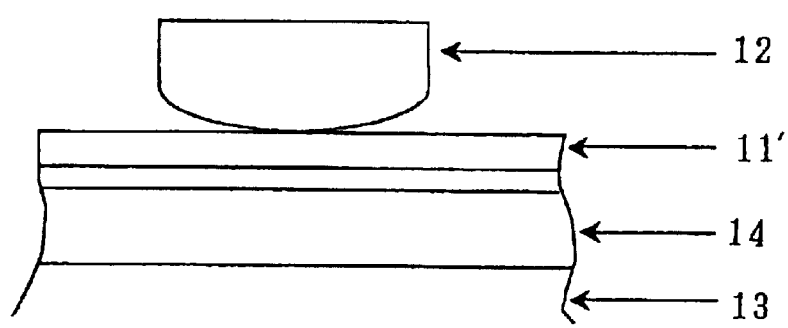
FIG.1 (B) Magnetic Tape

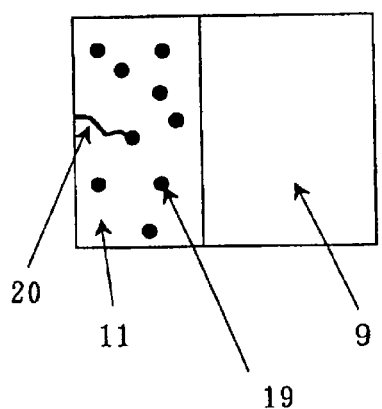 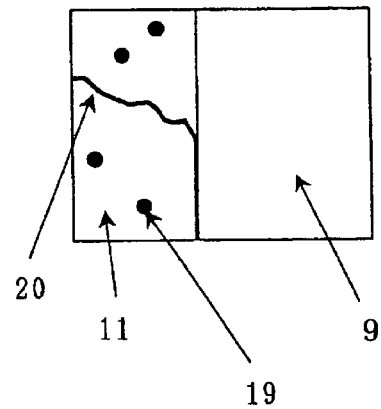
FIG.3 (A)                    FIG.3 (B)

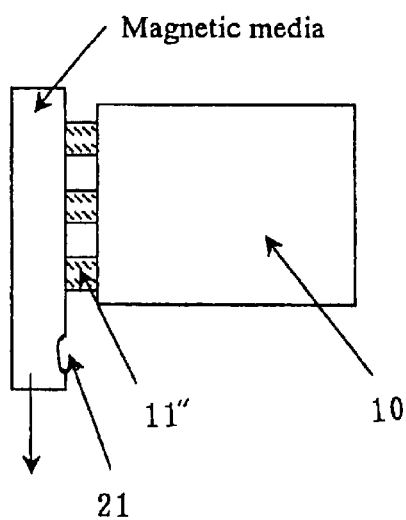 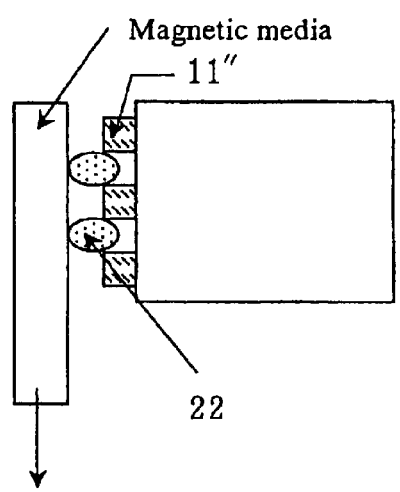
FIG.4 (A)　　　　　　　　FIG.4 (B)

DIAMOND-LIKE CARBON THIN FILM COATING PROCESS

BACKGROUND OF THE INVENTION

The present invention relates to a wear-resistant coating which exhibits properties of low-friction, low-clogging and resistance against static electricity. The invention relates further to a process for forming the coating and products utilizing same.

The aforementioned type coatings are generally formed over surfaces which are prone to wear, scratching, collecting of debris and formation of static electricity due to exposure to an external rubbing action. Magnetic recording media sensors (MRMS) which may be used for reading and/or writing of magnetically stored information are typical examples of such surfaces.

Coatings which have been recently developed are suitable for use in hard disc and floppy-disc reading/writing heads, video and audio heads, magnetic discs and magnetic tapes, magnetic counters, etc. As an MRMS operates in close and/or direct contact with other MRMS surfaces, debris and abrasive particles move relative thereto.

In accordance with conventional practice, the MRMS and its surface are coated by a protective film which includes at least two layers having different hardness and electrical conductivity. Moreover, such film is coated by means of chemical vapor deposition (CVD) with heating assistance. Due to such heating assistance, deformation of substrate and creation of inner stress is unavoidable, and the performance of the particular MRMS is consequently decreased. The external surface of the coating has a higher degree of hardness for providing an abrasion-proof surface, and the inner layer has comparatively low resistivity in order to abate the influence of static electricity. However, the use of multilayered film increases the coating thickness and/or decreases its wear resistance, and increases the production cost.

Accordingly, it is an object of the invention to provide an effective abrasion-proof, low-friction, low-clogging, static electricity erasing, thin film coating method.

It is a further object of the invention to provide an apparatus for forming such thin film coating which inhibits damage of the MRMS even when operating in close or direct contact with other MRMS surfaces, and in the presence of debris and abrasive particles moving relative thereto, even at low temperatures.

SUMMARY OF THE INVENTION

In accordance with these and other objects of the invention, an MRMS is coated directly with hard amorphous carbon (also referred to herein by the term "diamond-like carbon" or DLC) films having a high degree of hardness, smooth surface and low friction coefficient, to provide an abrasion-proof surface, which significantly abates the influence of static electricity and which collects a minimum amount of debris. These properties can be realized using vacuum pulse arc carbon sputtering and ion beam surface treatments. For purposes herein, the term "MRMS" will refer not only to the magnetic recording media sensor itself, but also alternatively to the media used with such sensor.

According to a preferred embodiment of the present invention, the content of $sp^3$-bonded carbon (hereinafter sometimes referred to as "$sp^3$") in the coating is within the range of about 30 to about 85 percent. The Vickers hardness is in the range of about 3000 to about 9000 $kg/mm^2$. The deposition process advantageously employs ion beams, and the coating process may be done with repetition of deposition and etching using such ion beams. Further, the beams may be scanned. One or more substrate holders are advantageously provided in a location in the deposition chamber out of projections of the ion and carbon sources in the direction of gravity, an electrical resistance of the substrate holder or holders to earth junction being set in a range of about 1 $M\Omega$ to about 10 $M\Omega$.

BRIEF DESCRIPTION OF THE DRAWINGS

FIG. 1A is a schematic representation of an MRMS in the form of a floppy disc head employing a coating formed by the process in accordance with the invention;

FIG. 1B is a schematic representation MRMS in the form of a magnetic tape employing a coating formed by the process in accordance with the invention;

FIG. 3A is a schematic diagram showing crack propagation in the coating depending on $sp^3$ proportion;

FIG. 3B is a schematic diagram showing another form of crack propagation in the coating depending on $sp^3$ proportion;

FIGS. 4A and 4B are schematic diagrams showing antibody damage and the MRMS clogging respectively due to the coating failure;

DETAILED DESCRIPTION OF THE INVENTION

Figure 2:
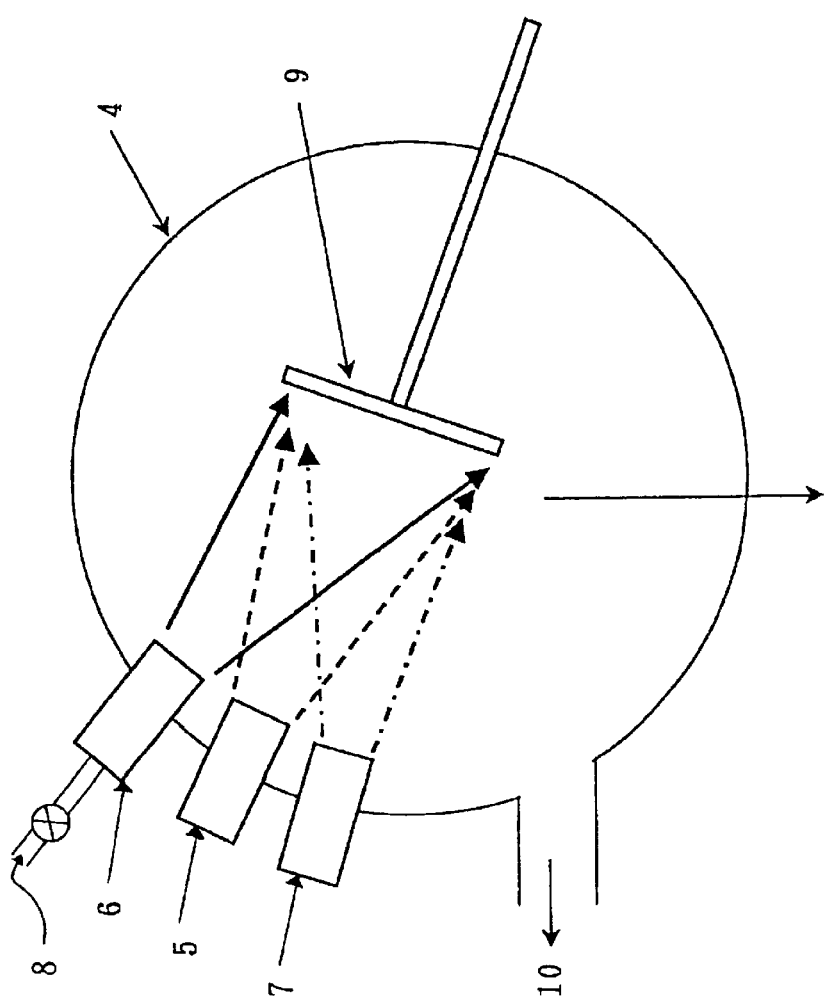
FIG. 2 is a schematic diagram showing an apparatus for deposition of the hard amorphous (diamond-like) carbon in accordance with the present invention.

Referring now to the figures, and in particular, FIGS. 1A and 1B, examples of different MRMS are illustrated, which incorporate the thin film coating in accordance with the invention. As shown in FIG. 1A, the MRMS (floppy disc) is comprised of a substrate 1, a magnetic media layer 2, and a protective layer 3. The external surface of MRMS (floppy disc head) 100 is coated with an amorphous, diamond-like carbon film 11 having a high degree of hardness, low friction coefficient and moderate electric resistivity providing abrasion-proof low-clogging, anti-static electricity properties thereby providing resistance against the tendency to wear, scratching, collecting of debris and static electricity due to an externally applied rubbing action. Similarly, FIG. 1B shows a tape head 12 and a tape comprising a tape layer 13, a magnetic media layer 14 and an amorphous, diamond-like carbon film 11.

Turning now to FIG. 2, a typical apparatus for deposition of a hard amorphous (diamond-like) carbon by pulse arc vacuum sputtering of graphite on a surface, in accordance with the present invention is depicted schematically. The surface to be coated may be made, for example, of semiconductor, glass, metal ceramics, organic resins, magnetic substance, etc.

The apparatus comprises a vacuum chamber 4, carbon pulse arc source (or sources) 5, gas ion source (or sources)

6, metal arc source (or sources) 7, a gas feeding system 8, substrate (MRMS) holder (or holders) 9 and a pumping system 10 including a pressure control, an oil diffusion pump and mechanical pump (not shown). Gas ion source 6, carbon pulse arc source 5 and metal arc source 7 are supplied with magnetic deviating coils (not shown) for controlling gas ion, carbon ion and metal ion beams, respectively.

During operation of the above-described apparatus, electric pulse arc sputtering of a graphite target with pulse frequency regulated from about 1 to about 30 Hz is performed, and carbon plasma is produced by carbon pulse arc source 5 and condensed on substrate 9, forming a hard amorphous (diamond-like) carbon coating thereon.

Gas ion source 6 may be employed for preliminary cleaning and/or etching of the surface of the substrate (MRMS) and/or for intermediate and/or final etching of the coating.

Gas ion energy of, for example, about 1 KeV to about 6 KeV is advantageously employed. Suitable gases include, for example, hydrogen, neon, argon, xenon, krypton, oxygen, nitrogen, hydrocarbons, fluorocarbons and mixtures thereof. The substrate temperature is maintained in a range of about +20° to about +300° C. by means of a temperature control unit (not shown). The diamond-like properties of the coatings deposited thereby, namely hardness, wear resistance, low friction coefficient and chemical inertness, are observed in this temperature range and, if necessary, in a range of about +100° to about +400° C. Ion beams are employed to clean and etch the substrate surface and deposit coatings conventionally. Disadvantages are: i) nonhomogeneity of the beam restricts the treated surface size; ii) in many cases power of the beam is limited by possible overheating of the substrates. However beam(s) scanning permits enlargement of the treated/deposited surface and cleaning/etching/deposition time less than the pumping time about 30 times, so as to result in a substantial increase of treated substrates area at the same quality. Arc metal source (s) 7 may be used to deposit an adhesive sublayer and/or to modify the coating properties, such as hardness and electric conductivity.

EXAMPLE 1

Hard amorphous (diamond-like) carbon is deposited onto MRMS, the latter provided in the form of floppy disc heads, as shown in FIG. 3A. The $sp^3$ proportion is 75%, the Vickers hardness is 8000 kg/mm$^2$, the resistivity is $1 \times 10^5$ Ωcm and the coating thickness is 10 nanometers. Due to optimal coating structure, the coating is shown to be stable and wear resistant.

The resultant MRMS demonstrates no noise, and output signal range in the 90–100% level for the designed receiving signal for over 400 hours.

Comparative Example 2

Hard amorphous (diamond-like) carbon is deposited onto MRMS, in the form of floppy disc heads. The $sp^3$ proportion 19 is lower than 30%, the hardness is lower than 3000 kg/mm$^2$ and the sensor life is the same as for the non-coated sensor. Within 50 hours, noise is detected and receiving output signal decreases to lower than 85% of the designed receiving signal.

Comparative Example 3

Hard amorphous (diamond-like) carbon (also referred to by the term "DLC") is deposited onto MRMS, in the form of floppy disc heads. The $sp^3$ proportion 19 is higher than 85% and the hardness is higher than 9000 kg/mm$^2$. As a result, internal stresses inside the DLC 11 rise and self-peeling of the coating sections is experienced. Even in cases where self-peeling does not occur, cracks 20 induced by external action easily reach the DLC-substrate surface and propagate therealong, as shown in FIG. 3B, such that the DLC 11 peels off the substrate.

Comparative Example 4

With a hardness higher than 9000 kg/mm$^2$, cracks induced by wearing easily reach the DLC-substrate surface and propagate therealong, such that the DLC peels off the substrate. The area of DLC 11 remaining on the surface results in damage 21 to magnetic media and/or collection of debris 22, as shown FIGS. 4A and 4B. This results in inappropriate sensor operation within 50 hours operation. It is to be understood that $sp^3$ porportion and hardness correlate, and the quality of the output of MRMS as a result of damage or collection of debris becomes impaired, namely, more noise and a weaker signal result, due to a longer distance to the magnetic media.

EXAMPLE 5

Figure 5:
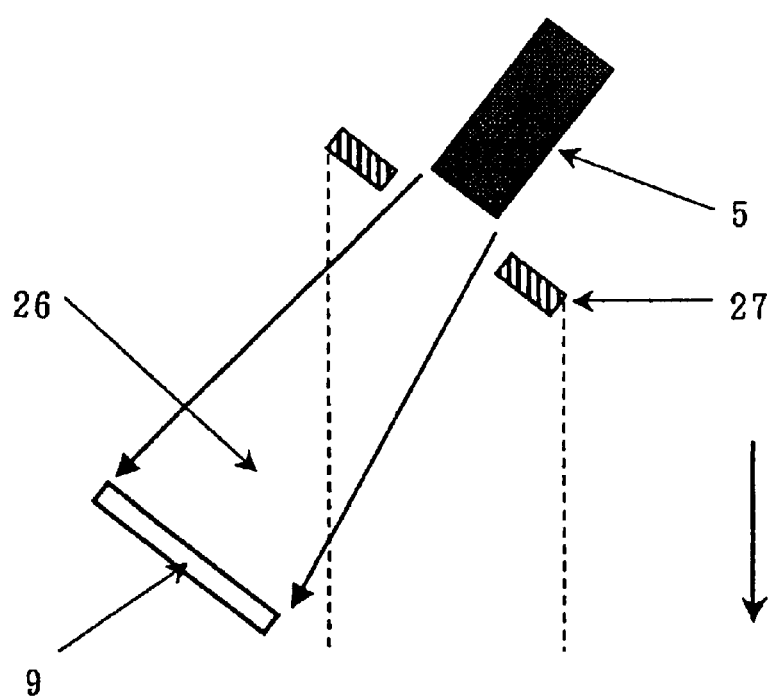
FIG. 5 is a schematic diagram of an MRMS holder, and sources and gravity direction relative a position thereof in the deposition chamber.

One or more substrate holders (not shown) each suitable for accommodating one or more substrates 9 are located out of the projection (region within dotted lines) in the gravity direction (as indicated by the downwardly pointing arrow) of the source(s) and parts associated therewith, as shown in FIG. 5. The beam is designated 26, the electrode 27 and the source 5. The MRMS yield is 99.99%.

Comparative Example 6

One or more substrate holders each suitable for accommodating one or more substrates are positioned at least partially inside of projection in the gravity direction of sources and associated parts. The MRMS yield drops from 99.99% (Example 5) to 90% due to falling dust particles deposited onto the substrates.

EXAMPLE 7

The ion source maximum power is 1 kVA, with a treated surface diameter of 100 mm. About 500 MRMS, in the form of floppy disc heads are locatable in this area. If the ion source power is 1 KVA, all the sensors would be overheated and adversely affected during treatment (>80° C.), so the power is 0.5 kVA, and treatment duration, 1 minute.

EXAMPLE 8

The same ion source (Example 7), with linearly scanned beam, and the treated surface has dimensions of 100 to 250 mm, scanning frequency of 0.1 to 1 Hz and controlling field intensity which is sine-like. About 1500 sensors may be located at this area. If the ion source power is 1 KVA, none of the sensors are overheated during treatment (<50° C.), so the treatment duration is 1.5 minute.

EXAMPLE 9

The same ion source (Example 8) with linearly scanned beam is used. The roughness of the treated surface is reduced through ion beam radiation. Table 1 shows the DLC surface roughness R in micrometers and R (DLC) of the same unit without etching. The rated thickness is 3 microns in Table 1 and 2 microns in Table 2. Both in Tables 1 and 2, DLC surface roughness is lower than initial substrate roughness.

TABLE 1

| R | R (DLC) |
|---|---|
| 0.2 | 0.4 |
| 0.25 | 0.5 |
| 0.50 | 1.0 |
| 0.65 | 1.25 |
| 0.75 | 1.55 |
| 1.2 | 2.0 |
| 1.7 | 3.2 |

TABLE 2

| R | R (DLC) |
|---|---|
| 0.15 | 0.35 |
| 0.25 | 0.30 |
| 0.40 | 0.70 |
| 0.70 | 0.65 |
| 0.70 | 0.55 |
| 0.85 | 0.75 |

Example and Comparative Example 10

Figure 6:
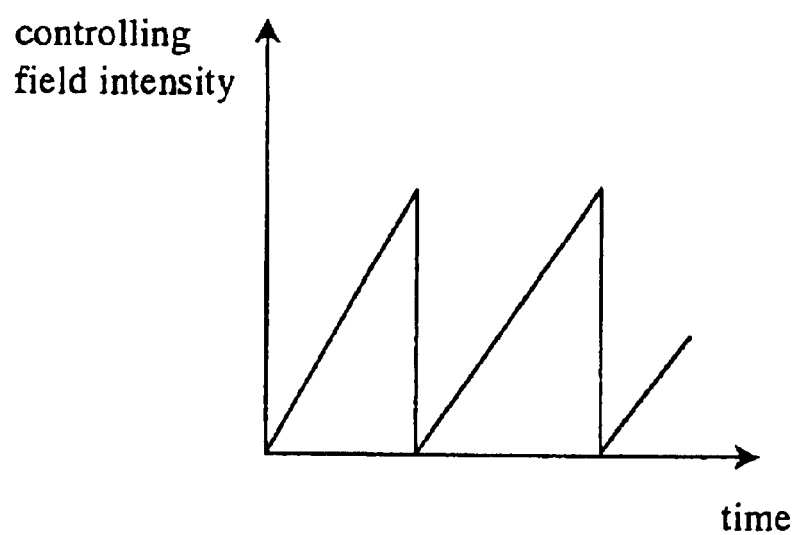
FIG. 6 is a schematic diagram of an ion beam controlling field intensity vs. ion treatment time.

The same ion source with linearly scanned beam is used. The treated surface has dimensions of 100 to 250 mm at a scanning frequency of 1 Hz and in which a controlling field intensity is saw-like, as shown in FIG. 6. At the middle part of the treated surface, the etched depth is the same as at margins thereof. However, when the controlling field intensity is sine like, at the middle part of the treated surface the etched depth is 10% more than at the margins.

Example and Comparative Example 11

The pulse arc carbon source maximum frequency is 30 Hz and a uniformly deposited surface has a diameter of 100 mm. About 500 sensors may be located at this area. If the carbon source frequency is 2 Hz, all of the sensors will be overheated (adversely affected) during treatment (>80° C.), so the frequency must be 1 Hz, and treatment duration, 1 minute.

EXAMPLE 12

The same carbon source with linearly scanned beam is used. A uniformly treated surface has dimensions of 100 to 250 mm. About 1500 sensors may be located at this area. If the carbon source frequency is 2 Hz, none of the sensors are overheated during treatment (<50° C.), so the treatment duration is 1 minute. Scanning is step-like (two fixed positions, synchronically with source pulses).

EXAMPLE 13

The beam is scanned randomly and/or has some rotation when applied for treatment of an MRMS having a complicated shape, or when the MRMS or their holder dimensions are larger than the beam size. This achieves a homogeneous coating layer.

Examples and Comparative Examples 14

The MRMS is a video head. Sensors holder(s) assembly insulation to vacuum chamber (=earth) during ion etching and DLC deposition may be regulated in range 0Ω to 10 MΩ. The percentage number of heads spoiled due to electric discharge near the gap during DLC deposition vs. holder-to-earth insulation is shown in Table 3.

TABLE 3

| Holder-to-earth insulation | Percent of the sensors spoiled |
|---|---|
| 0.5 | 1.1 |
| 0.7 | 0.5 |
| 0.8 | 0.3 |
| 1.0 | 0.1 |
| 4.0 | 0.03 |
| 6.0 | 0.04 |
| 8.0 | 0.02 |
| 10.0 | 0.1 |
| 20.0 | 0.5 |

Figure 7:
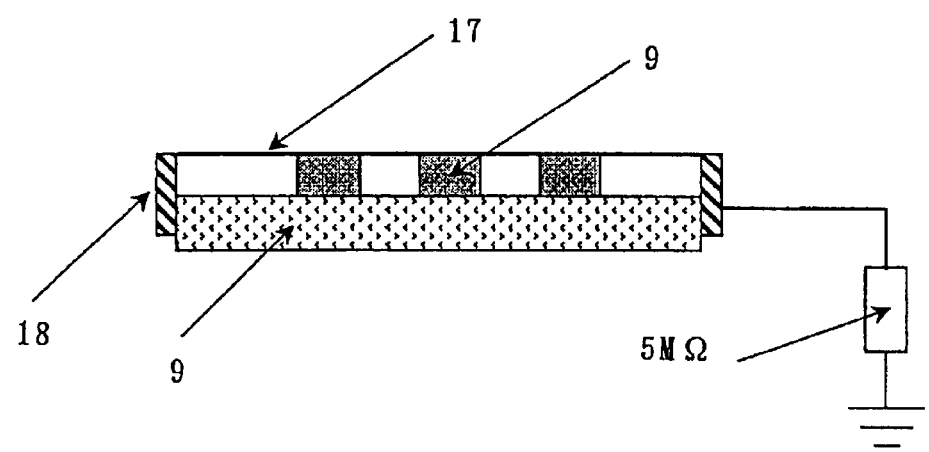
FIG. 7 is a schematic diagram of the MRMS holder.

The substrate (sensor) holder 9 is made of a suitable plastic, in these examples, nylon. To fix the substrates (sensors) 11 and release static electricity, metal wires 17 held in frames 18 are adopted as shown in FIG. 7.

Comparative Example 15

A DLC coating 10 nm thick is deposited directly (without intermediate and final etching) onto an MRMS, namely a floppy disc head. Surface roughness is 3 nm and friction coefficient is 0.2. Working life of the sensor coated is within 50 hours and receiving output signal decreased lower than 85% of designed receiving signal.

EXAMPLE 16

A DLC coating 13 nm thick is deposited without intermediate etching and final etched with oxygen ions to 10 nm. Surface roughness is 1.8 nm and friction coefficient is 0.08. Working life of the sensor coated is at least 400 hours and receiving output signal is within 90–100% of designed receiving signal.

EXAMPLE 17

Figure 8:
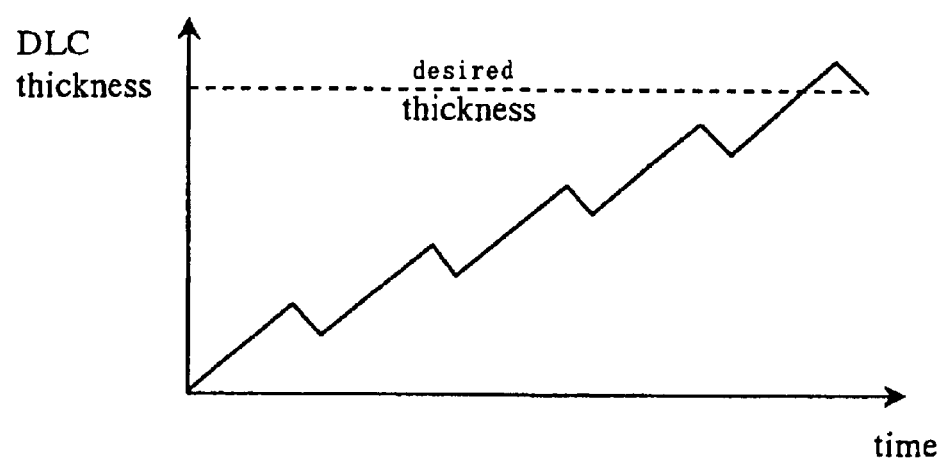
FIG. 8 is a schematic diagram of the coating thickness vs. deposition-etching process time.

A DLC coating 12 nm thick is deposited with intermediate etching with oxygen ions in the following way: five steps consisting of 3 nm DLC deposition and 1 nm etching each as shown in FIG. 8. Surface roughness is 0.8 nm and friction coefficient is 0.04. Working life of the sensor coated is over 400 hours and receiving output signal is over 95% of designed receiving signal.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A method of forming an amorphous carbon coating on a surface of a substrate, comprising:
    producing carbon plasma by sputtering of a solid carbon target; and
    depositing the coating by disposing the substrate in a position in which the surface of the substrate is exposed to said carbon plasma comprised of positively charged carbon ions moving in a plasma beam direction for a desired duration, said position being laterally spaced from the carbon target and outside a region below said solid carbon target within which non-charged dust particles produced during said step of producing fall by operation of gravity to inhibit deposition of said dust particles on said at least one surface of the substrate, at least a portion of said surface of the substrate being angularly inclined from a horizontal orientation in a same direction as a plane perpendicular to the plasma direction.

2. A method according to claim 1, wherein a temperature of the substrate is maintained at less than about 50° C. during said step of depositing.

3. A method according to claim 1, wherein a temperature of the substrate is maintained in a range of about 20° C. to about 300° C. during said step of depositing.

4. A method according to claim 1, wherein said steps of producing and disposing are carried out in a vacuum chamber.

5. A method according to claim 1, wherein said carbon target is graphite.

6. A method according to claim 1, wherein said step of producing includes electric pulse arc sputtering with a pulse frequency regulated from about 1 Hz to about 30 Hz.

7. A method according to claim 1, wherein the coating thus formed has a Vickers hardness in a range of about 3000 to about 9000 kg/mm$^2$.

8. A method according to claim 1, wherein said step of depositing includes securing the substrate to a holder, an electrical resistance of the holder to ground being set in a range of about 1 MΩ to about 10 MΩ.

9. A method according to claim 1, wherein a content of sp$^3$-bonded carbon in the coating thus formed is in a range of about 30% to about 85%.

10. A method of forming an amorphous carbon coating on a surface of a substrate, comprising:

producing carbon plasma by sputtering of a solid carbon target;

depositing the coating by exposing the surface of the substrate to said carbon plasma comprised of positively charged carbon ions moving in a plasma beam direction for a predetermined duration, a position of said substrate during said step of depositing being laterally spaced from the carbon target and outside a region below said solid carbon target within which non-charged dust particles produced during said step of producing fall by operation of gravity to inhibit deposition of said dust particles on said surface of the substrate;

halting said step of producing after said predetermined duration; and etching said coating by exposing said coating to gas ions such that a coating thickness is reduced by a predetermined amount.

11. A method according to claim 10, further comprising repeating said steps of depositing the coating and etching for a desired number of repetitions such that the coating is sequentially deposited as having an initial thickness and reduced in thickness reduced by the subsequent step of etching.

12. A method according to claim 11, wherein a coating thickness is increased beyond the initial thickness prior to etching by a subsequent carrying out of said step of depositing.

13. A method according to claim 12, further comprising repeating said step of etching after a final step of depositing to reduce the coating thickness.

14. A method according to claim 10, wherein said step of producing includes electric pulse arc sputtering with a pulse frequency regulated from about 1 Hz to about 30 Hz.

15. A method according to claim 10, wherein the coating thus formed has a Vickers hardness in a range of about 3000 to about 9000 kg/mm$^2$.

16. A method according to claim 10, wherein said step of depositing includes securing the substrate to a holders, an electrical resistance of the holders to ground being set in a range of about 1 MΩ to about 10 MΩ.

17. A method according to claim 10, wherein a content of sp$^3$-bonded carbon in the coating thus formed is in a range of about 30% to about 85%.

18. A method of forming an amorphous carbon coating on an external surface of a magnetic recording media sensor, comprising:

producing carbon plasma comprised of positively charged carbon atoms by sputtering of a solid carbon target;

magnetically accelerating said carbon ions for movement thereof in a plasma direction away from said carbon target; and depositing the coating by disposing the magnetic recording media sensor in a position in which the surface of the magnetic recording media sensor is exposed to said carbon plasma which has been magnetically accelerated and continuing said steps of producing and accelerating for a desired duration, said position being laterally spaced from the carbon target and outside a region below said solid carbon target within which non-charged dust particles produced during said step of producing fall by operation of gravity to inhibit deposition of said dust particles on said surface of the magnetic recording media sensor whereby the amorphous carbon coating thus formed is substantially free of particulate impurities produced during said step of producing carbon plasma.

19. A method according to claim 18, wherein a temperature of the magnetic recording media sensor is maintained at less than about 50° C. during said desired duration.

20. A method according to claim 19, wherein said desired duration is about 1.5 minutes.

21. A method according to claim 18, wherein said step of producing includes electric pulse arc sputtering with a pulse frequency regulated from about 1 Hz to about 30 Hz.

22. A method according to claim 18, wherein the coating thus formed has a Vickers hardness in a range of about 3000 to about 9000 kg/mm$^2$.

23. A method according to claim 18, wherein said step of depositing includes securing the magnetic recording media sensor to a holder, an electrical resistance of the holder to ground being set in a range of about 1 MΩ to about 10 MΩ.

24. A method according to claim 18, wherein a content of sp$^3$-bonded carbon in the coating thus formed is in a range of about 30% to about 85%.

* * * * *